United States Patent
Won et al.

(10) Patent No.: US 7,476,922 B2
(45) Date of Patent: Jan. 13, 2009

(54) LOGIC DEVICE HAVING VERTICALLY EXTENDING METAL-INSULATOR-METAL CAPACITOR BETWEEN INTERCONNECT LAYERS AND METHOD OF FABRICATING THE SAME

(75) Inventors: Seok-Jun Won, Seoul (KR); Yong-Kuk Jeong, Seoul (KR); Dae-Jin Kwon, Seoul (KR); Min-Woo Song, Seoul (KR); Weon-Hong Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 121 days.

(21) Appl. No.: 10/969,098

(22) Filed: Oct. 20, 2004

(65) Prior Publication Data

US 2005/0087879 A1    Apr. 28, 2005

(30) Foreign Application Priority Data

Oct. 28, 2003    (KR) .................... 10-2003-0075670

(51) Int. Cl.
*H01L 27/108* (2006.01)
*H01L 29/94* (2006.01)

(52) U.S. Cl. ............................... 257/301; 257/E29.343

(58) Field of Classification Search ................. 257/301, 257/303, 304, 306–310, 532, 534; 438/243, 438/244, 386, 396
See application file for complete search history.

(56) References Cited

U.S. PATENT DOCUMENTS

| | | | | |
|---|---|---|---|---|
| 5,005,102 A | * | 4/1991 | Larson | 361/313 |
| 6,057,571 A | * | 5/2000 | Miller et al. | 257/296 |
| 6,072,210 A | * | 6/2000 | Choi | 257/303 |
| 6,162,679 A | | 12/2000 | Lin | |
| 6,251,740 B1 | | 6/2001 | Johnson et al. | 438/381 |
| 6,346,454 B1 | * | 2/2002 | Sung et al. | 438/396 |
| 6,376,328 B1 | | 4/2002 | Aiso et al. | 438/398 |
| 6,417,535 B1 | * | 7/2002 | Johnson et al. | 257/306 |
| 6,441,419 B1 | * | 8/2002 | Johnson et al. | 257/296 |
| 6,559,497 B2 | * | 5/2003 | Shih et al. | 257/306 |
| 6,583,457 B1 | | 6/2003 | Howard | |
| 6,646,323 B2 | * | 11/2003 | Dirnecker et al. | 257/532 |
| 6,767,788 B2 | * | 7/2004 | Kim | 438/253 |
| 6,794,694 B2 | * | 9/2004 | Diodato et al. | 257/295 |
| 2002/0079522 A1 | | 6/2002 | Diodato et al. | 257/296 |
| 2002/0163029 A1 | * | 11/2002 | Dirnecker et al. | 257/306 |
| 2003/0213989 A1 | * | 11/2003 | Delpech et al. | 257/301 |
| 2004/0087098 A1 | * | 5/2004 | Ng et al. | 438/381 |

FOREIGN PATENT DOCUMENTS

JP    01-177076    6/2001

* cited by examiner

*Primary Examiner*—David A Zarneke
(74) *Attorney, Agent, or Firm*—Mills & Onello LLP

(57) ABSTRACT

A logic device having a vertically extending MIM capacitor between interconnect layers includes a semiconductor substrate. A lower interconnect layer is located over the semiconductor substrate, and an upper interconnect layer is located over the lower interconnect layer. A U-shaped lower metal plate is interposed between the lower interconnect layer and the upper interconnect layer. The U-shaped lower metal plate directly contacts the lower interconnect layer. The capacitor dielectric layer covers the inner surface of the lower metal plate. Further, the capacitor dielectric layer has an extension portion interposed between the brim of the lower metal plate and the upper interconnect layer. An upper metal plate covers the inner surface of the capacitor dielectric layer. The upper metal plate is in contact with the upper interconnect layer and is confined by the capacitor dielectric layer.

7 Claims, 9 Drawing Sheets

LOGIC DEVICE HAVING VERTICALLY EXTENDING METAL-INSULATOR-METAL CAPACITOR BETWEEN INTERCONNECT LAYERS AND METHOD OF FABRICATING THE SAME

CROSS-REFERENCE TO RELATED APPLICATION

This application claims priority from Korean Patent Application No. 2003-75650, filed on Oct. 28, 2003, the contents of which are hereby incorporated herein by reference in their entirety as if set forth fully herein.

BACKGROUND OF THE INVENTION

1. Field of the Invention

This disclosure relates to a logic device and a method of fabricating the same and more particularly, to a logic device having a vertically extending metal-insulator-metal capacitor between interconnect layers and a method of fabricating the same.

2. Description of the Related Art

Generally, a capacitor of a logic device is used as an impedance element. The capacitor used as an impedance element must be linear in its response characteristics. Therefore, a metal-insulator-metal (MIM) capacitor is normally used in the logic device instead of a poly-insulator-poly (PIP) capacitor which exhibits non-linear response characteristics due to charge depletion.

Chemical mechanical polishing (CMP) smooths relatively significant variations in height of the different components to a planar surface. Smoothing or planarizing the variable-height topology to a planar surface allows the typical lithographic semiconductor fabrication techniques to be used to form considerably more layers than were previously possible in IC construction. That is, even though many layers are formed in a stack, the stacked layers can be patterned by using photolithography processes because the surface of the layers is planarized. Thus, CMP technology allows more circuitry to be incorporated on a single substrate in a single IC. As a result, with the employment of CMP technology in the fabrication process of semiconductor devices, a large number of interconnections (referred to as "interconnect layers") can be layered in a stack.

The interconnect layers are insulated by an interlayer insulating layer. If a capacitor is formed inside the interlayer insulating layer between the interconnect layers, it does not consume the space on the semiconductor substrate, and it is possible to provide a capacitor suitable for a logic device and save space.

With the high-integration of the logic device, there is required a capacitor capable of providing a high capacitance in a unit surface area on a semiconductor substrate.

An MIM capacitor between interconnect layers for providing high capacitance in a unit surface area is disclosed in U.S. Pat. No. 6,057,571, entitled, "High aspect ratio, metal-to-metal, linear capacitor for an integrated circuit," to Miller, et. al.

In the capacitor disclosed by Miller, upper and lower metal plates vertically extend between interconnect layers. Thus, the capacitor has a relatively high aspect ratio and a relatively large value of capacitance in consideration of the surface area it consumes.

However, in the capacitor disclosed by Miller, the thickness of an insulating layer interposed between the brim of the lower metal plate and the upper plate is not greater than the deposition thickness of a capacitor dielectric layer. Because the brim of the lower metal plate is caught by an electric field more than other locations, a leakage current is often generated, unless the thickness of the capacitor dielectric layer is high.

Further, the method of fabricating a capacitor disclosed by Miller includes forming lower interconnect layers. An interlayer insulating layer is formed on the semiconductor substrate having the lower interconnect layers formed thereon, and the interlayer insulating layer is patterned so as to form a capacitor hole. Then, a lower U-shaped metal plate is formed inside the capacitor hole. Then, a capacitor dielectric layer is formed on the semiconductor substrate having the lower U-shaped metal plate formed thereon. Then, by using a typical photolithography technology, the capacitor dielectric layer and the interlayer insulating layer are patterned so as to form a via hole. The via hole exposes the lower interconnect layer. An upper plate is formed on the overall surface of the semiconductor substrate having the via hole formed thereon. The upper plate covers the top surface of the capacitor dielectric layer. Further, the upper plate extends to cover the side walls of the via hole, and the extended upper plate is connected electrically to the exposed lower interconnect layer.

According to the method, after the capacitor dielectric layer is formed, the via hole is formed using a photolithography technology. Thus, it is necessary to form a photoresist layer on the capacitor dielectric layer. Since the photoresist layer includes organic components such as hydrogen or carbon, it can contaminate the dielectric layer.

Further, after the lower interconnect layer is exposed, it is necessary to remove a native oxide layer on the top surface of the exposed lower interconnect layer in order to form the upper plate. Thus, after the via hole is formed, a cleaning process of the oxide layer is required before the upper plate is formed. However, the cleaning process of the oxide layer may remove a part of the capacitor dielectric layer, and thereby damage the capacitor dielectric layer. As a result, the thickness of the capacitor dielectric layer interposed between the brim of the lower plate and the upper plate becomes much thinner, so that the leakage current characteristics may be degraded.

SUMMARY OF THE INVENTION

Exemplary embodiments of the present invention provide a logic device having an MIM capacitor between interconnect layers to enhance the leakage current characteristics compared to the conventional technology.

A feature of the present invention is to provide a method of fabricating a logic device having an MIM capacitor between interconnect layers for avoiding the damage and contamination of a capacitor dielectric layer and for improving the leakage current characteristics compared to the conventional technology.

In accordance with an exemplary embodiment, the present invention provides a logic device having a vertically extending MIM capacitor between interconnect layers. With the exemplary embodiment of the present invention, the logic device includes a semiconductor substrate. A lower interconnect layer is located over the semiconductor substrate and an upper interconnect layer is located over the lower interconnect layer. A U-shaped lower metal plate is interposed between the lower interconnect layer and the upper interconnect layer. The lower metal plate is in contact with the lower interconnect layer. A capacitor dielectric layer covers the inner surface of the lower metal plate. The capacitor dielectric layer has an extension portion interposed between the brim of the lower metal plate and the upper interconnect layer. An upper metal plate covers the inner surface of the capacitor dielectric layer. The upper metal plate is in contact with the upper interconnect layer and is confined by the capacitor dielectric layer.

As such, because the extension portion of the capacitor dielectric layer is interposed between the brim of the lower metal plate and the upper interconnect layer, the leakage current characteristics can be improved.

In one embodiment, a second lower interconnect layer is located at the same level as the first lower interconnect layer and a second upper interconnect layer is located at the same level as the first upper interconnect layer. The second lower interconnect layer and the second upper interconnect layer are electrically connected to each other through a via plug. Further, in one embodiment, an interlayer insulating layer is interposed between the second lower interconnect layer and the second upper interconnect layer. The interlayer insulating layer extends to cover the outer side walls of the lower metal plate and the outer side walls of the extension portion of the capacitor dielectric layer. Further, in one embodiment, the capacitor dielectric layer extends to be interposed between the interlayer insulating layer and the upper interconnect layer. The capacitor dielectric layer may be interposed between the interlayer insulating layer and the second upper interconnect layer. In one embodiment, the second lower interconnect layer is electrically connected to the lower interconnect layer, and the second upper interconnect is electrically insulated from the first upper interconnect layer.

In one embodiment, the extension portion of the capacitor dielectric layer may have a height of 200 Å to 1000 Å. The height of the extension portion of the capacitor dielectric layer can be adjusted in accordance with the leakage current characteristics.

In accordance with second exemplary embodiment, the present invention provides a logic device having a vertically extending MIM capacitor between interconnect layers. With the exemplary embodiment of the present invention, the logic device includes a semiconductor substrate. A lower interconnect layer is located over the semiconductor substrate and an upper interconnect layer is located over the lower interconnect layer. A plurality of U-shaped lower metal plates are interposed between the lower interconnect layer and the upper interconnect layer. The lower metal plates are spaced from each other and are in contact with the lower interconnect layer. Capacitor dielectric layers cover the inner surface of the respective lower metal plates. Each of the capacitor dielectric layers has an extension portion interposed between the brim of the lower metal plates and the upper interconnect layer. Further, upper metal plates cover the inner surface of the respective capacitor dielectric layers. Each of the upper metal plates is in contact with the upper interconnect layer and is confined by the capacitor dielectric layer. As such, because a plurality of capacitors are formed between the interconnect layers, a high capacitance can be provided.

In second aspect of the present invention, the present invention provides a method of fabricating a logic device having a vertically extending MIM capacitor. The method includes preparing a semiconductor substrate having a lower insulating layer. A first lower interconnect layer and a second lower interconnect layer are formed over the semiconductor substrate. An interlayer insulating layer is formed over the semiconductor substrate having the first lower interconnect layer and the second lower interconnect layer formed thereon, and by patterning the interlayer insulating layer using a photolithography and etching process, at least one capacitor hole for exposing the top surface of the first lower interconnect layer is formed. There is formed a lower metal plate covering the top surface of the exposed first lower interconnect layer and the sidewalls of the at least one capacitor hole, and being recessed inside the capacitor hole. A capacitor dielectric layer, an upper metal plate layer, and a capacitor plug layer are formed conformably on the overall surface of the semiconductor substrate having the lower metal plate formed thereon. By removing the capacitor plug layer and the upper metal plate layer until the top surface of the capacitor dielectric layer is exposed, an upper metal plate and a capacitor plug, which are confined by the capacitor dielectric layer, are formed. After the upper metal plate is formed, by patterning the exposed dielectric layer and the interlayer insulating layer, there is formed a via hole for exposing the second lower interconnect layer. A via plug for burying the via hole is formed. A first upper interconnect layer being in contact with the upper metal plate, and a second upper interconnect layer being in contact with the via plug is formed over the semiconductor substrate having the via plug formed thereon.

In accordance with the method of the present invention, after a recessed lower metal plate is formed, a capacitor dielectric layer is formed. The capacitor dielectric layer has an extension portion covering the inner surface of the lower metal plate and the upper brim of the lower metal plate. The height of the extension portion of the capacitor dielectric layer may be adjusted depending on how recessed the lower metal plate is. Thus, the height of the extension portion of the capacitor dielectric layer interposed between the lower metal plate and the first upper interconnect layer may be adjusted, thereby improving the leakage current characteristics. Further, the method includes forming a via hole after the upper metal plate is formed. Thus, the contamination and damage of the capacitor dielectric layer while the via hole is formed or the via plug is formed can be avoided.

In one embodiment, the method of forming the lower metal plate includes forming conformably a lower metal plate layer on the overall surface of the semiconductor substrate having the at least one capacitor hole formed thereon. An etch sacrificial layer for filling the at least one capacitor hole is formed on the overall surface of the semiconductor substrate having the lower metal plate layer formed thereon. By overall-etching the etch sacrificial layer, there is formed a recessed etch sacrificial layer, which is confined inside the at least one capacitor hole. Then, by etching the lower metal plate layer by using the recessed etch sacrificial layer as an etch mask, the lower metal plate layer is recessed inside the at least one capacitor hole. The recessed etch sacrificial layer is removed. The lower metal plate layer may be etched using a dry or wet etch process.

The method of forming the first upper interconnect layer and the second upper interconnect layer includes forming an upper conductive layer on the semiconductor substrate having the via plug formed thereon. The upper conductive layer may be patterned using photolithography and etching processes.

Alternatively, the first upper interconnect layer and the second upper interconnect layer are formed using Damascene process. That is, an upper insulating layer is formed on the semiconductor substrate having the via plug formed thereon. By patterning the upper insulating layer using photolithography and etching processes, a first groove for exposing the upper metal plate and a second groove for exposing the via plug are formed. Then, an upper conductive layer is formed on the semiconductor substrate having the grooves formed thereon. The upper conductive layer is planarized using CMP technology until the upper insulating layer is exposed.

In one embodiment, after the top surface of the capacitor dielectric layer is exposed, by removing the exposed capacitor dielectric layer, the upper metal plate, and the capacitor plug until the top surface of the interlayer insulating layer is exposed, there are formed an upper metal plate confined inside the at least one capacitor hole and a capacitor plug confined inside the at least one capacitor hole. The via hole is formed by patterning the interlayer insulating layer.

In one embodiment, the via plug and the upper interconnect layers may be formed using a dual Damascene process. That is, after the upper metal plate is formed, an upper insulating layer is formed. By sequentially patterning the upper insulating layer, the capacitor dielectric layer, and the interlayer insulating layer, there may be formed a groove for exposing the upper metal plate, a via hole for exposing the second lower interconnect layer, and a second groove intersecting over the via hole. The second groove is formed at the same level as the first groove. Then, an upper conductive layer is formed. By patterning the upper conductive layer by using CMP technology, there may be formed a first upper interconnect layer for filling the groove, a via plug for filling the via hole, and a second upper interconnect layer for filling the second groove. As such, the via hole and the upper interconnect layers can be formed at the same time. In the meantime, in order to form the via hole and the grooves, before forming the upper insulating layer, an etch barrier layer may be further formed.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

Figure 13:
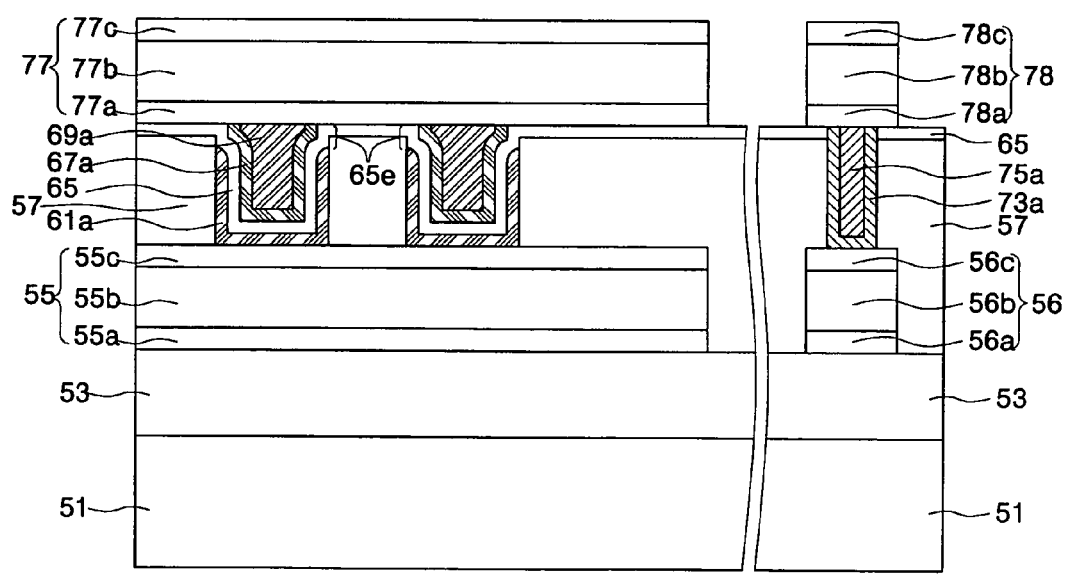

FIG. 13 is a schematic sectional view illustrating a logic device according to an embodiment of the present invention.

Referring to FIG. 13, a lower interconnect layer 55 is placed over a semiconductor substrate 51. The lower interconnect layer 55 is separated from the semiconductor substrate 51 by a lower insulating layer 53.

The lower interconnect layer 55 may be a layered stack including a diffusion barrier layer 55a, a main conductive layer 55b, and a capping layer 55c. The main conductive layer 55b may be formed of aluminum (Al) or copper (Cu), or may be a layered stack of both. Each of the diffusion barrier layer 55a and the capping layer 55c may be titanium (Ti), titanium nitride (TiN), tantalum (Ta), tantalum nitride (TaN), ruthenium (Ru), or tungsten nitride (WN) layer, or may be an at least two-layered stack of those layers.

An upper interconnect layer 77 is placed over the lower interconnect layer 55. The upper interconnect layer 77 may be a layered stack including a diffusion barrier layer 77a, a main conductive layer 77b, and a capping layer 77c, as those of the lower interconnect layer 55.

U-shaped lower metal plates 61a are interposed between the upper interconnect layer 77 and the lower interconnect layer 55. A single U-shaped lower metal plate 61a may be interposed between the upper interconnect layer 77 and the lower interconnect layer 55. The U-shaped lower metal plates 61a are aligned and spaced from each other, and directly contact the lower interconnect layer 55. The lower metal plates 61a may be Ti, TiN, Ta, TaN, Ru or WN layer, or may be an at least two-layered stack of those layers.

Capacitor dielectric layers 65 cover the inner surface of the respective lower metal plates 61a. Further, the capacitor dielectric layers 65 have extension portions (or extension layers) 65e, each of which is interposed between the brim of the lower metal plate 61a and the upper interconnect layer 77. Preferably, the capacitor dielectric layer 65 may be tantalum oxide ($Ta_2O_5$), aluminum oxide ($Al_2O_3$), hafnium oxide ($HfO_2$), zirconium oxide ($ZrO_2$), lanthanum oxide ($La_2O_3$), titanium oxide ($TiO_2$), strontium oxide ($SrTiO_3$; ST), or barium strontium oxide ($Ba_xSr_{1-x}TiO_3$; BST) layer, or may be an at least two-layered stack of those layers. The extension portion 65e may be 200 Å to 1000 Å in height.

Upper metal plates 67a are located to cover the inner surface of the respective capacitor dielectric layers 65. The upper metal plates 67a directly contact the upper interconnect layer 77. The upper metal plates 67a may be Ti, TiN, Ta, TaN, Ru, or WN layer, or may be an at least two-layered stack of those layers. Preferably, the empty space inside the upper metal plate 67a can be filled with a capacitor plug 69a. The capacitor plug 69a may be formed of the same material layer as the upper metal plate 67a, or may be a tungsten (W) layer.

Preferably, second lower interconnect layer 56 can be placed over the semiconductor substrate 51 at the same level as the lower interconnect layer 55, and second upper interconnect layer 78 can be placed at the same level as the upper interconnect layer 77. The second lower interconnect layer 56 and the second upper interconnect layer 78 may be formed of the same material layer as the lower interconnect layer 55 and the upper interconnect layer 77, respectively, and can have the same layered stack structures. The second lower interconnect layer 56 and the second upper interconnect layer 78 are electrically connected through a via plug 75a. The via plug 75a may be formed of Al, Cu, or W layer, or may be an at least two-layered stack of those layers. A via diffusion barrier layer 73a may be formed to cover the sidewalls and the bottom surface of the via plug 75a. The via diffusion barrier layer 73a may be formed of Ti, TiN, Ta, TaN, or WN layer, or may be an at least two-layered stack of those layers. The via diffusion barrier layer is a material layer different from the upper metal plate layer.

Further, an interlayer insulating layer 57 may be interposed between the second lower interconnect layer 56 and the second upper interconnect layer 78. The interlayer insulating layer 57 covers the outer sidewalls of the via plug 75a. The via diffusion barrier layer 73a is interposed between the interlayer insulating layer 57 and the via plug 75a. Further, the interlayer insulating layer 57 extends to cover the outer side walls of the lower metal plates 61a and the outer side walls of the extension portions 65e. The interlayer insulating layer 57 may be a silicon oxide layer ($SiO_2$), a silicon nitride layer (SiN), or a low-k dielectric layer. In the meantime, the capacitor dielectric layers 65 extend to be interposed between the upper interconnect layer 77 and the interlayer insulating layer 57. Further, the capacitor dielectric layers 65 may be interposed between the second upper interconnect layer 78 and the interlayer insulating layer 57.

Preferably, the second lower interconnect layer 56 and the lower interconnect layer 55 may be electrically connected. The second upper interconnect layer 78 is electrically insulated from the upper interconnect layer 77.

According to a preferred embodiment of the present invention, the extension portions 65e of the capacitor dielectric layers 65 are interposed between the brim of the lower metal plates 61a and the upper interconnect layer 77, so as to improve leakage current characteristics.

Now hereinafter, a method of fabricating a logic device according to a preferred embodiment of the present invention will be described in detail.

Figure 1:
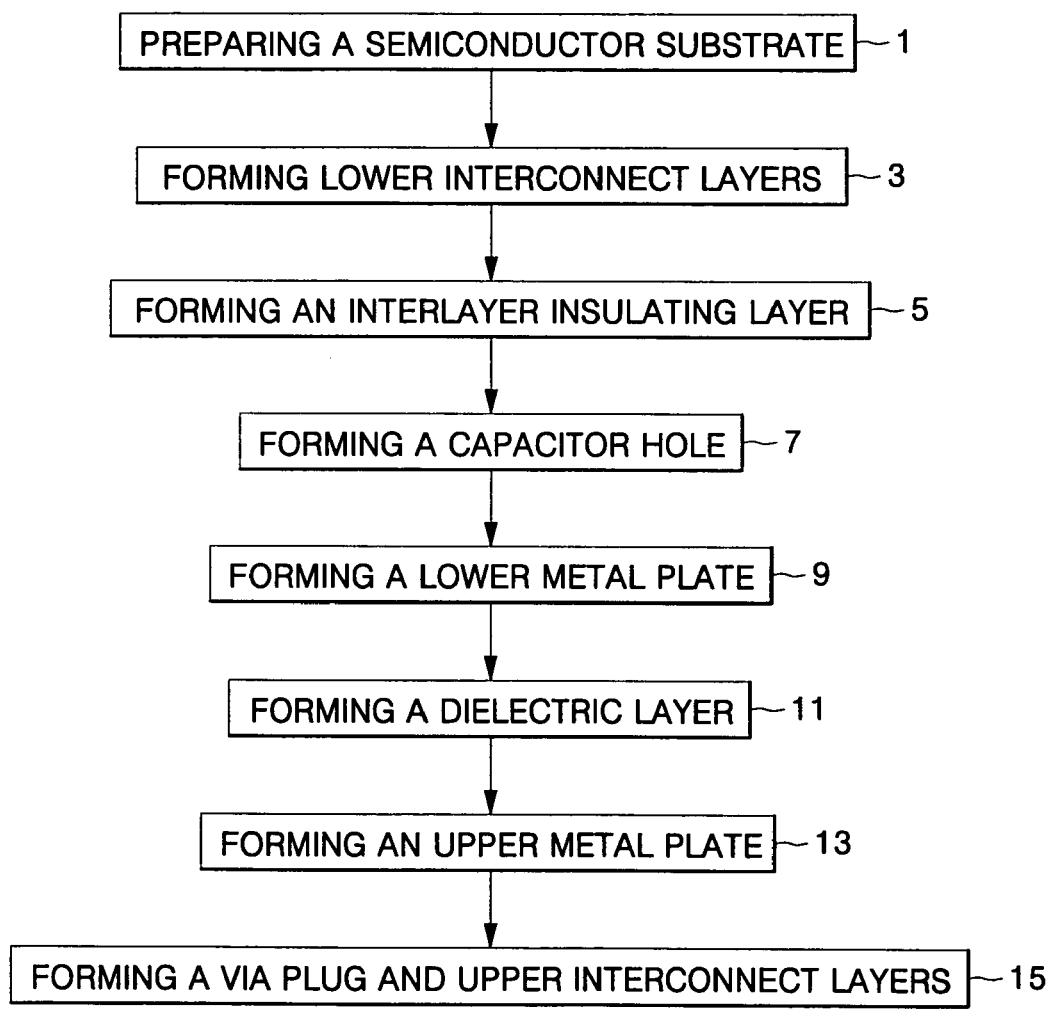
FIG. 1 illustrates processing sequences of a method of fabricating a logic device according to an embodiment of the present invention.

FIG. 1 illustrates processing sequence steps of a method of fabricating a logic device according to embodiments of the present invention, and FIGS. 2 to 13 are schematic sectional views illustrating a method of fabricating a logic device according to one embodiment of the present invention.

Figure 2:
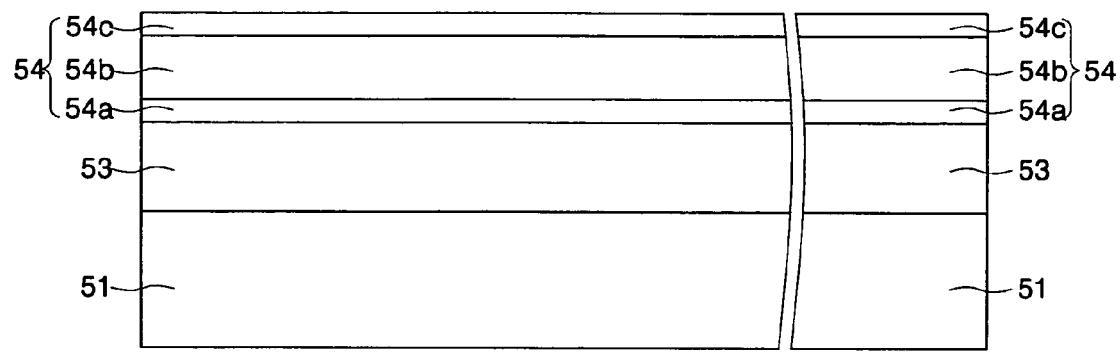
FIGS. 2 to 13 are sectional views illustrating a method of fabricating a logic device according to one embodiment of the present invention.

Referring to FIGS. 1 and 2, a semiconductor substrate 51 having a lower insulating layer 53 is prepared (step 1 of FIG. 1).

A lower conductive layer 54 is formed on the lower insulating layer 53. The lower conductive layer 54 may be a layered stack including a diffusion barrier layer 54a, a main conductive layer 54b, and a capping layer 54c. Each of the diffusion barrier layer 54a and the capping layer 54c may be formed of Ti, TiN, Ta, TaN, Ru, or WN layer, or may be an at least two-layered stack of those layers. The main conductive layer 54b may be formed of Al or Cu layer, or may be a layered stack of those layers.

Figure 3:
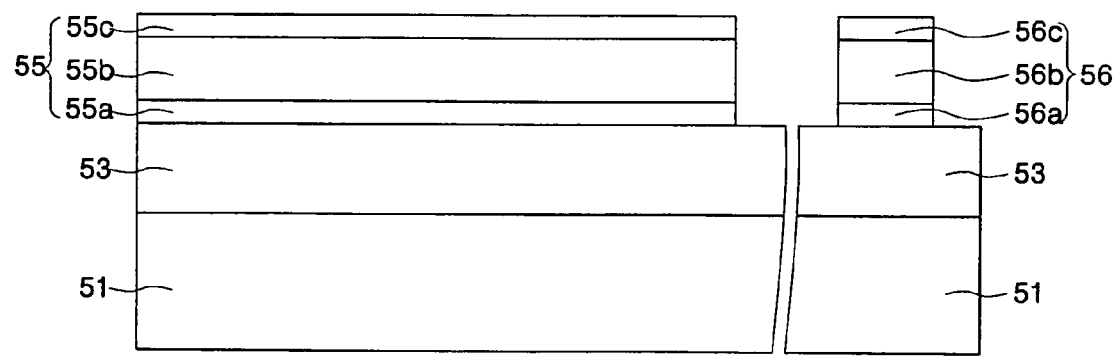

Referring to FIGS. 1 and 3, by patterning the lower conductive layer 54 using photolithography and etching processes, a lower interconnect layer 55 and a second lower interconnect layer 56 are formed (step 3 of FIG. 1). The lower interconnect layer 55 and the second lower interconnect layer 56 may be layered stacks including diffusion barrier layers 55a, 56a, main conductive layers 55b, 56b, and capping layers 55c, 56c, respectively.

Preferably, the lower interconnect layer 55 and the second lower interconnect layer 56 may be electrically connected to each other.

The lower interconnect layer 55 and the second lower interconnect layer 56 may be formed by using Damascene process. That is, by patterning the lower insulating layer 53 before forming the lower conductive layer 54, grooves are formed in the portions in which interconnect layers are to be formed. Then, the lower conductive layer 54 for filling the grooves is formed. At this time, the capping layer 54c (of FIG. 2) is not formed. The lower conductive layer 54 is planarized by using CMP technology until the top surface of the lower insulating layer 53 is exposed. As a result, the lower interconnect layer 55 and the second lower interconnect layer 56, which are confined by the lower insulating layer 53, are formed.

Figure 4:
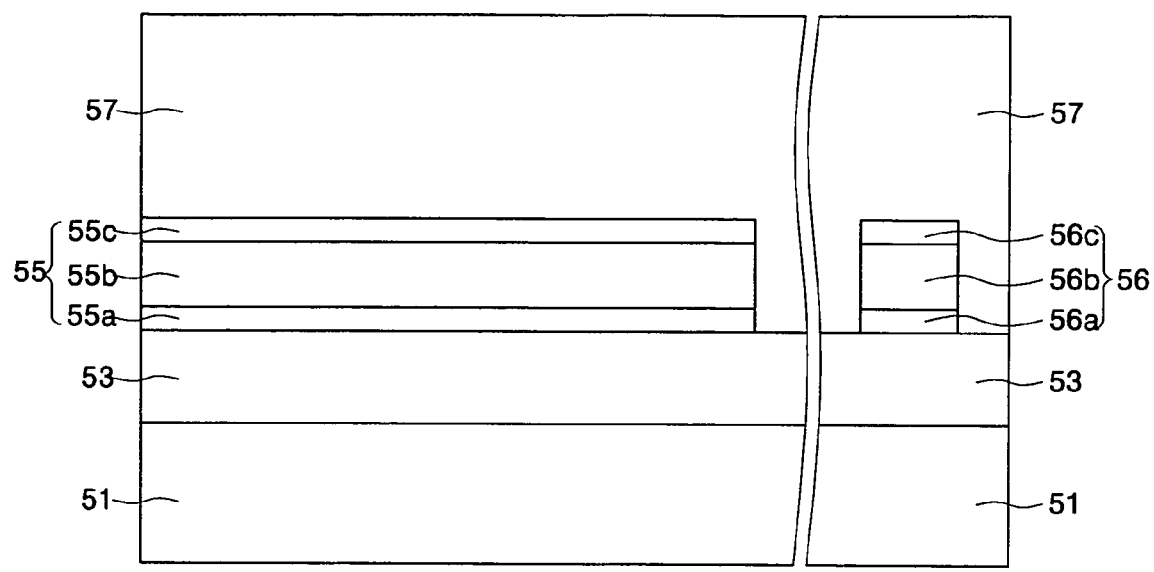

Referring to FIGS. 1 and 4, an interlayer insulating layer 57 is formed over the semiconductor substrate having the lower interconnect layers 55, 56 formed thereon (step 5 of FIG. 1). The interlayer insulating layer 57 covers the top surfaces of the lower interconnect layers 55, 56, and fills the empty space between the lower interconnect layers 55, 56. The height of the interlayer insulating layer 57 may be varied depending on positions due to the lower interconnect layers 55, 56. The interlayer insulating layer 57 may be planarized using CMP technology.

In the case in which the lower interconnect layers 55, 56 are formed by using Damascene process, the lower insulating layer 53 fills the space between the lower interconnect layers 55, 56. Therefore, the interlayer insulating layer 57 is formed only on the top surfaces of the lower interconnect layers 55, 56.

The interlayer insulating layer 57 may be formed of $SiO_2$, SiN, or low-k dielectric layer, or may be an at least two-layered stack of those layers. In specific, in the case in which the main conductive layer 55b of the lower interconnect layer 55 is formed of copper (Cu), a silicon nitride layer (SiN) or a silicon oxynitride layer (SiON) may be formed under the interlayer insulating layer 57 in order to prevent the diffusion of Cu.

Figure 5:
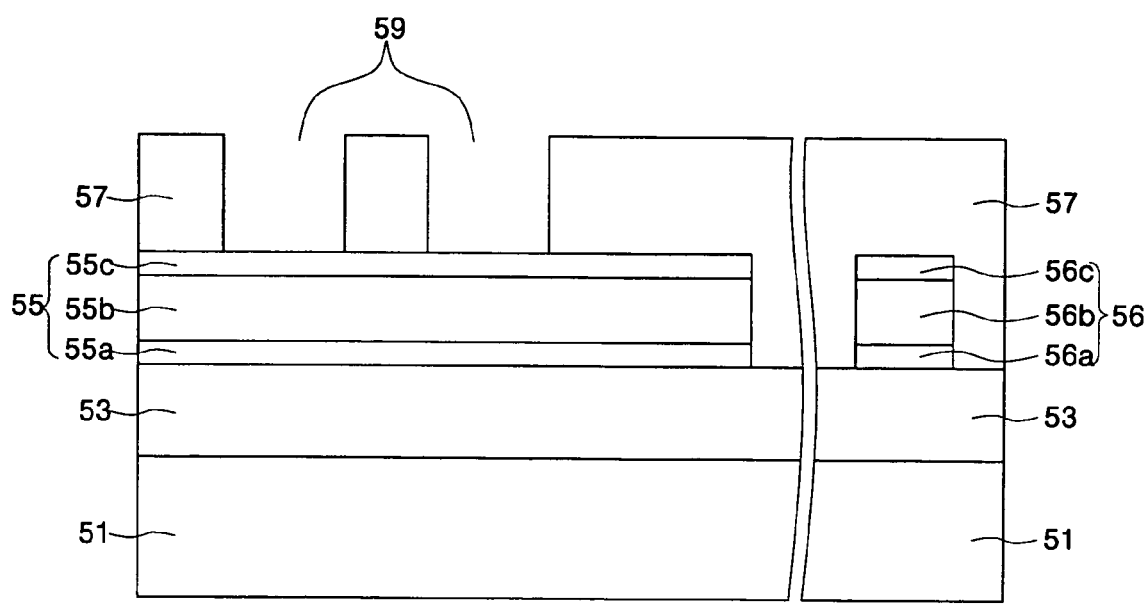

Referring to FIGS. 1 and 5, the interlayer insulating layer 57 is patterned using photolithography and etching processes, so as to form at least one capacitor hole 59 for exposing the upper interconnect layer 55 (step 7 of FIG. 1). The at least one capacitor hole 59 may have a circular shape or elliptic shape in its opening. Alternatively, the at least one capacitor hole 59 may have a slot shape. In one embodiment, in the case in which a plurality of capacitor holes 59 are formed, the capacitor holes 59 are formed to be aligned with regularly spacing.

Figure 6:
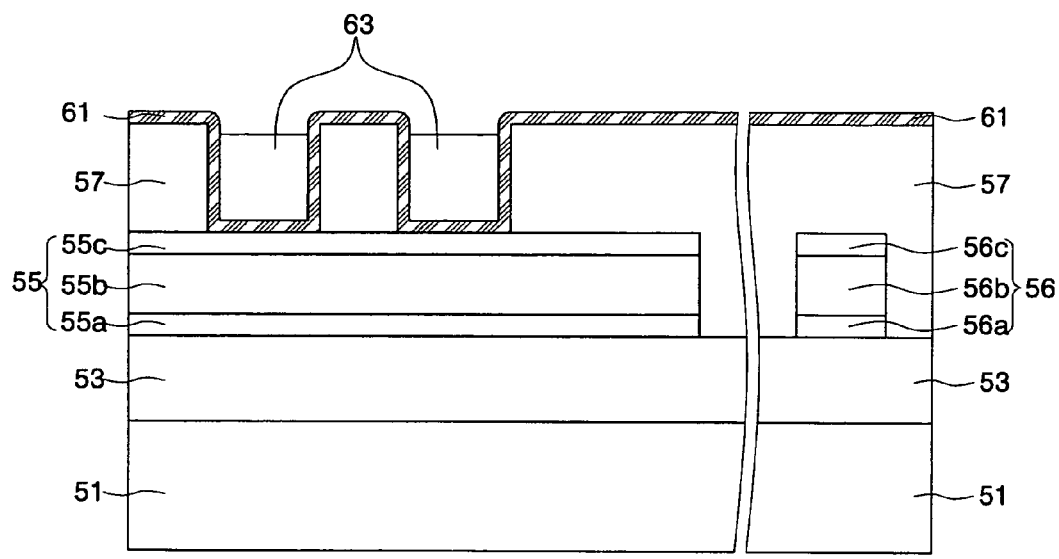

Referring to FIGS. 1 and 6, a lower metal plate layer 61 is conformably formed over the semiconductor substrate having the at least one capacitor hole 59 formed thereon. The lower metal plate layer 61 may be formed of Ti, TiN, Ta, TaN, Ru, or WN layer, or may be an at least two-layered stack of those layers.

An etch sacrificial layer is formed over the semiconductor substrate having the lower metal plate layer 61 formed thereon in order to bury the capacitor hole 59. The etch sacrificial layer may be formed of a silicon oxide layer having a high etch selectivity, such as a photoresist layer, polymer, or USG (undoped silicate glass). The etch sacrificial layer is etched all over the layer, so as to form etch sacrificial layers 63, which are recessed inside the capacitor holes 59.

Figure 7:
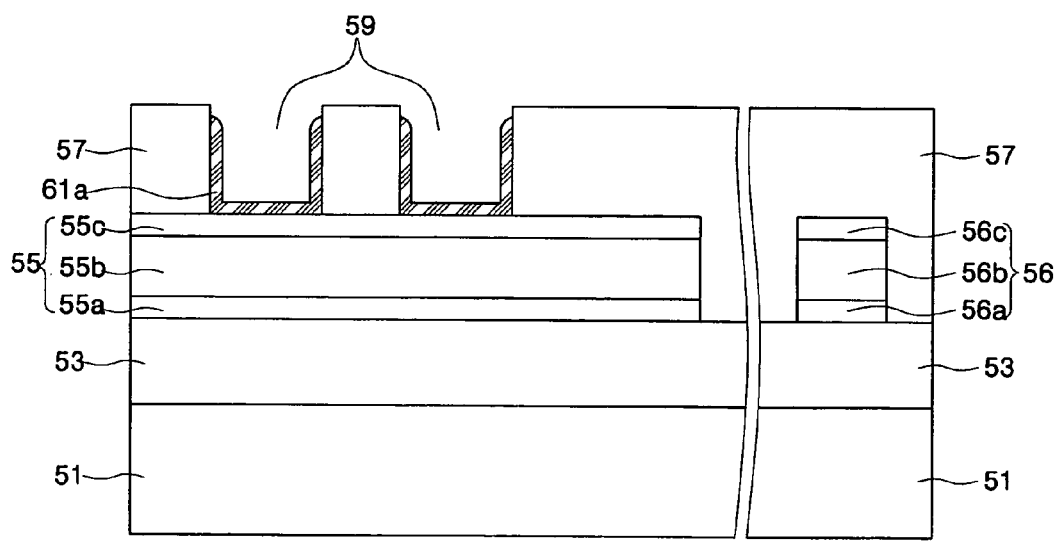

Referring to FIGS. 1 and 7, the lower metal plate layer 61 is etched using the recessed etch sacrificial layers 63 as etch masks, so as to form recessed lower metal plates 61a, which are confined inside the capacitor holes 59 (step 9 of FIG. 1). The lower metal plate layer 61 can be etched using dry or wet etching technology. The lower metal plates 61a are formed recessed relative to the interlayer insulating layer 57. The height of the lower metal plates 61a recessed relative to the interlayer insulating layer is preferably 200 Å to 1000 Å.

Figure 8:
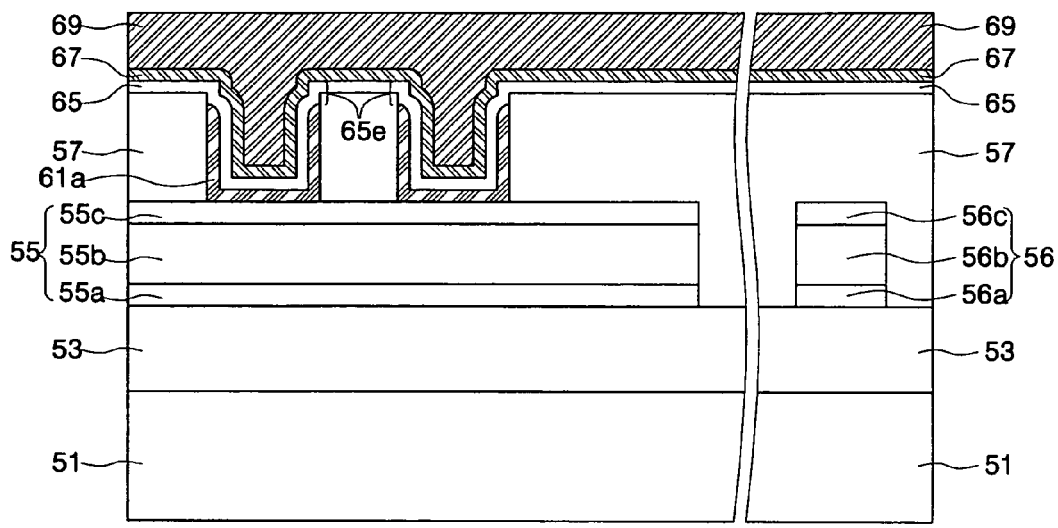

Referring to FIGS. 1 and 8, a capacitor dielectric layer 65, an upper metal plate layer 67, and a capacitor plug layer 69 are sequentially formed over the semiconductor substrate having the lower metal plates 61a formed thereon. The capacitor dielectric layer 65 covers the inner surface of the respective lower metal plates 61a and the surface of the interlayer insulating layer 57. Therefore, extension portions 65e of the capacitor dielectric layer 65 are formed on the brim or top edge of the lower metal plates 61a. The capacitor dielectric layer 65 may be $Ta_2O_5$, $Al_2O_3$, $HfO_2$, $ZrO_2$, $La_2O_3$, $TiO_2$, ST or BST layer, or may be an at least two-layered stack of those layers (step 11 of FIG. 1).

The upper metal plate layer 67 may be Ti, TiN, Ta, TaN, Ru, or WN layer, or may be an at least two-layered stack of those layers. Further, the capacitor plug layer 69 may be the same material layer as the upper metal plate layer 67, or may be a tungsten (W) layer.

Figure 9:
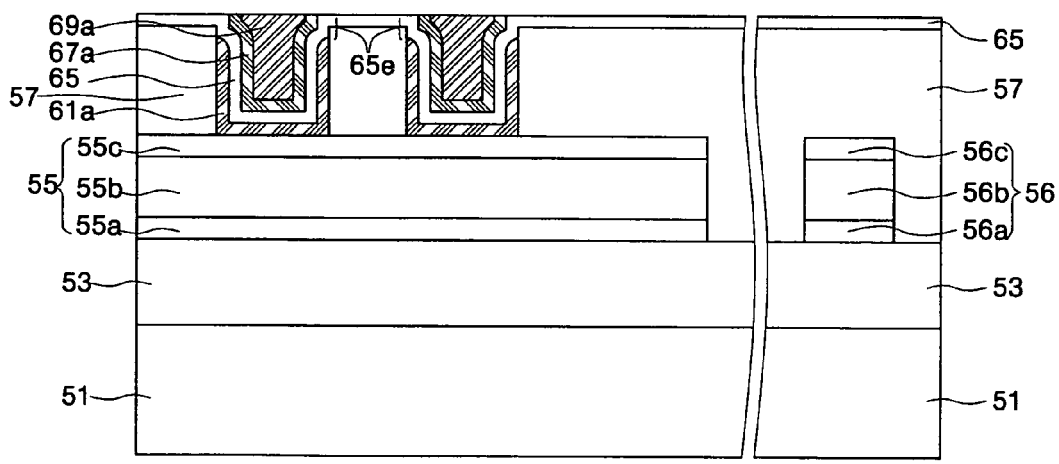

Referring to FIGS. 1 and 9, the capacitor plug layer 69 and the upper metal plate layer 67 are removed to expose the capacitor dielectric layer 65, so as to form an upper metal plate 67a and a capacitor plug 69a, which are confined inside the capacitor dielectric layer 65 (step 13 of FIG. 1). The capacitor plug layer 69 and the upper metal plate layer 67 can be removed using an overall etching or CMP technology.

The exposed capacitor dielectric layer 65 can be also removed. At this time, the upper metal plate 67a and the capacitor plug 69a are confined inside the capacitor hole 59, and the top surface of the interlayer insulating layer 57 is exposed.

Figure 10:
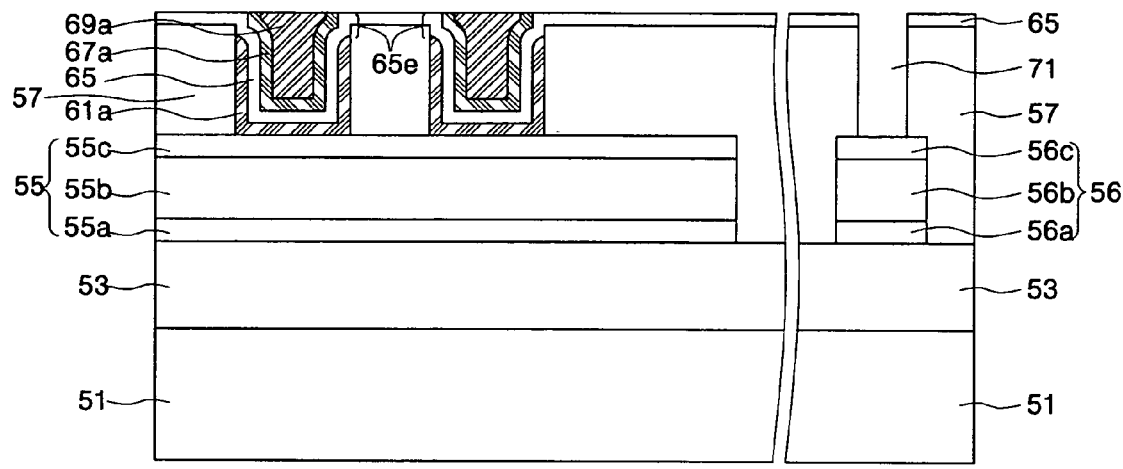

Referring to FIGS. 1 and 10, after the upper metal plates 67a are formed, the capacitor dielectric layer 65 and the interlayer insulating layer 57 are patterned using photolithography and etching processes, so as to form a via hole 71 for exposing the second lower interconnect layer 56. While the via hole 71 is being formed, the capacitor dielectric layer 65 inside the capacitor hole 59 is protected by the upper metal plate 67a and the capacitor plug 69a. Therefore, the photoresist layer is prevented from directly contacting the capacitor dielectric layer 65 inside the capacitor hole 59. Therefore, contamination of the capacitor dielectric layer 65 by the photoresist layer can be avoided.

Figure 11:
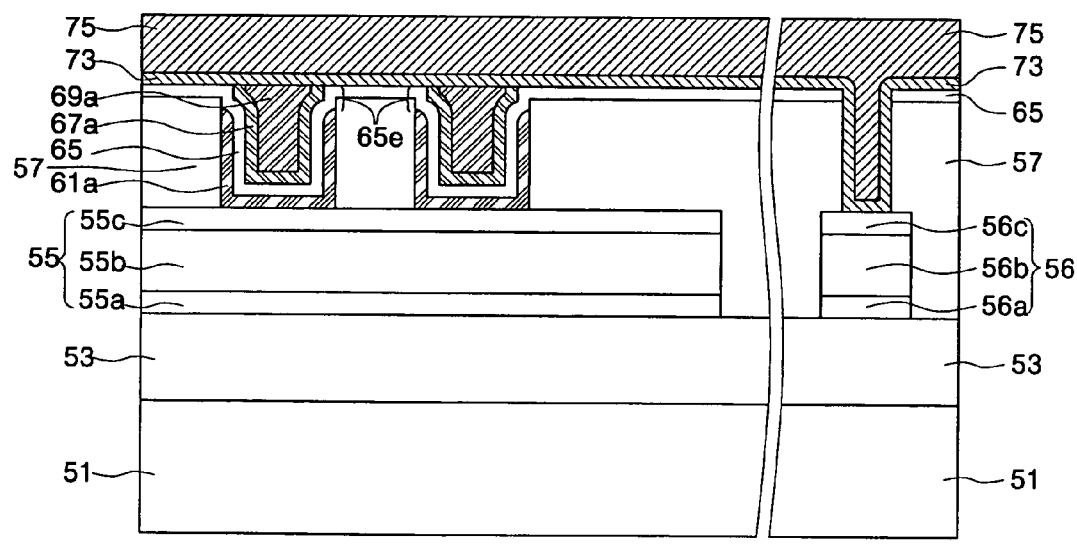

Referring to FIGS. 1 and 11, a via plug layer 75 is formed over the semiconductor substrate having the via hole 71 formed thereon, so as to fill the via hole 71. The via plug layer 75 may be formed of Al, W, or Cu, or may be formed of an at least two-layered stack of those layers.

Before forming the via plug layer 75, a via diffusion barrier layer 73 can be formed. The via diffusion barrier layer 73 may be formed of Ti, TiN, Ta, TaN, Ru, or WN layer, or may be formed of an at least two-layered stack of those layers.

Figure 12:
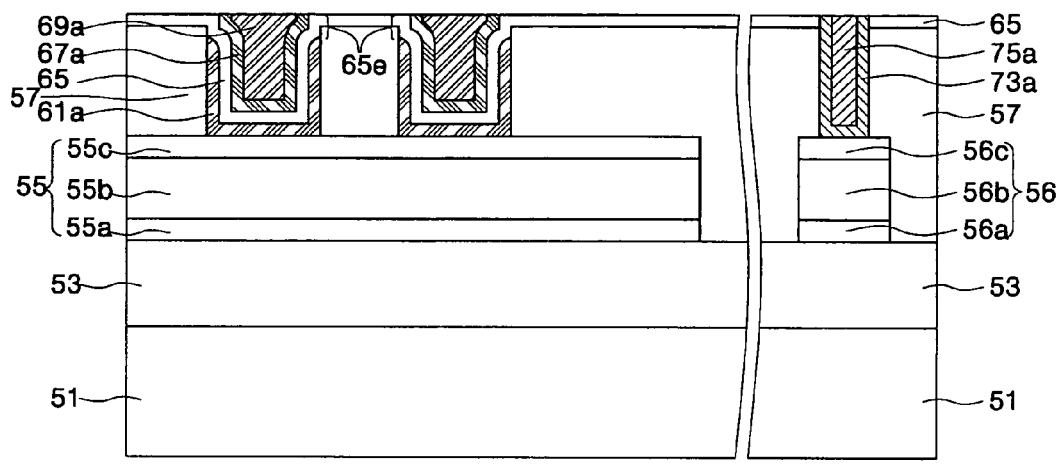

Referring to FIGS. 1 and 12, the via plug layer 75 and the via diffusion barrier layer 73 are sequentially removed, so as to form a via diffusion barrier layer 73a and a via plug 75a, which are confined inside the via hole 71 (step 15 of FIG. 1).

Referring to FIGS. 1 and 13, an upper conductive layer is formed over the semiconductor substrate having the via plug 75a formed thereon. The upper conductive layer may be a layered stack including a diffusion barrier layer, a main conductive layer, and a capping layer, as in the lower conductive layer 54. Each of the diffusion barrier layer and the capping layer may be formed of Ti, TiN, Ta, TaN, Ru, or WN layer, or may be formed of an at least two-layered stack of those layers. The main conductive layer may be formed of Al or Cu, and may be formed of a layered stack of both.

The upper conductive layer is patterned using photolithography and etching processes, so as to form an upper interconnect layer 77 and a second upper interconnect layer 78 (step 15 of FIG. 1). The upper interconnect layer 77 is located over the lower interconnect layer 55, and intersects over the upper metal plates 67a and the capacitor plugs 69a. The upper interconnect layer 77 may be a layered stack including a diffusion barrier layer 77a, a main conductive layer 77b, and a capping layer 77c.

The second upper interconnect layer 78 contacts the via plug 75a. The second upper interconnect layer 78 may be a line intersecting over the via plug 75a, or may be a pad surrounded by an insulating layer. The second upper interconnect layer 78 may be formed of the same material layer as the upper interconnect layer 77, and has the same stack structure as that of the upper interconnect layer 77. Therefore, the second upper interconnect layer 78 may have a layered stack structure including a diffusion barrier layer 78a, a main conductive layer 78b, and a capping layer 78c, as those of the upper interconnect layer 77.

The upper interconnect layer 77 and the second upper interconnect layer 78 can be formed by Damascene process. That is, an upper insulating layer (not shown) is formed over the semiconductor substrate having the via plug 75a formed thereon. The upper insulating layer is patterned using photolithography and etching processes, so as to form grooves (not shown) for exposing the upper metal plates 67a, and a second groove (not shown) for exposing the via plug 75a. Then, an upper conductive layer is formed. The upper conductive layer may be a layered stack including a diffusion barrier layer and a main conductive layer. The upper conductive layer is planarized using CMP technology until the top surface of the upper conductive layer is exposed, so as to form an upper interconnect layer and second upper interconnect layer, which are confined inside the grooves.

Figure 14:
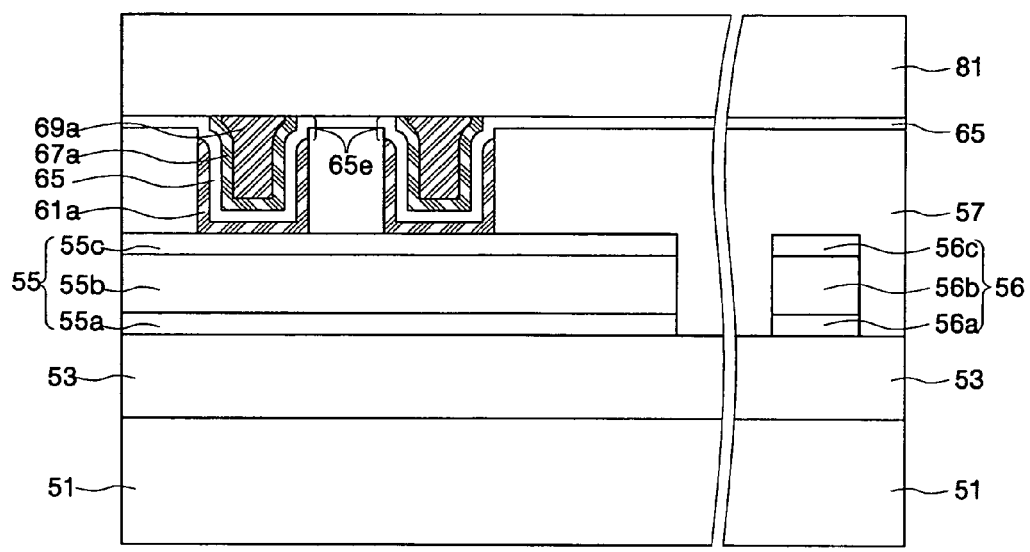
FIGS. 14 to 16 are sectional views illustrating a method of fabricating a logic device according to second embodiment of the present invention.
Figure 15:
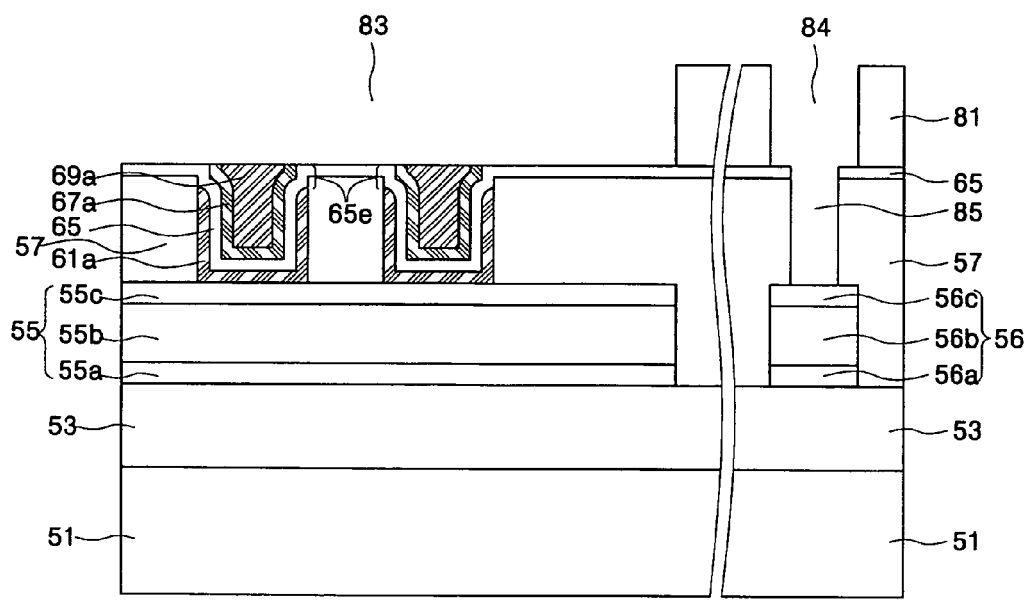
Figure 16:
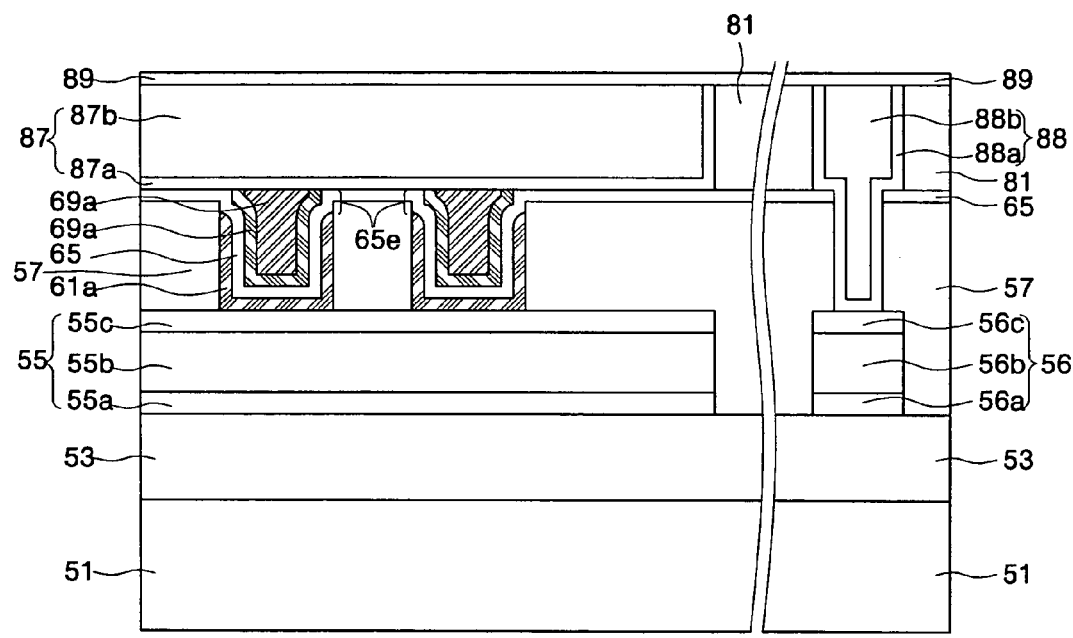

FIGS. 14 to 16 are sectional views illustrating a method of fabricating a logic device according to another embodiment of the present invention. Herein, a method of forming concurrently the via plug and the upper interconnect layers by using dual Damascene process is illustrated.

Referring to FIG. 14, after step 13 of FIG. 1 (FIG. 9) is completed, an upper insulating layer 81 is formed over the semiconductor substrate having the upper metal plate 67a and the capacitor plug 69a formed thereon. Before forming the upper insulating layer 81, an etch barrier layer such as a silicon nitride layer may be formed.

Referring to FIG. 15, the upper insulating layer 81 and the interlayer insulating layer 57 are patterned using photolithography and etching processes, so as to form a groove 83 intersecting over the upper metal plates 67a, a via hole 85 for exposing the second lower interconnect layer 56, and a second groove 84 intersecting over the via hole 85.

Referring to FIG. 16, an upper conductive layer is formed over the semiconductor substrate having the grooves 83, 84 and the via hole 85 formed thereon. The upper conductive layer may be a layered stack including a diffusion barrier layer and a main conductive layer. The upper conductive layer 87 fills the via hole 85 and the grooves 83, 84.

The upper conductive layer 87 is planarized using CMP technology until the top surface of the upper insulating layer 81 is exposed. As a result, there are formed an upper interconnect layer 87, which is confined inside the groove 83, and a second upper interconnect layer 88, which is confined inside the second groove 84. The second upper interconnect layer 88 fills the via hole 85, and is electrically connected to the second lower interconnect layer 56.

The upper interconnect layer 87 and the second upper interconnect layer 88 may have layered stacks including diffusion barrier layers 87a, 88a, and main conductive layers 87b, 88b, respectively. Afer the upper interconnect layers 87, 88 are formed, a capping insulating layer 89 may be formed over the semiconductor substrate having the upper interconnect layers formed thereon. The capping insulating layer 89 functions to prevent the metal atoms of the main conductive layers 87b, 88b from being diffused.

As a result, the via plug and the upper interconnect layers are formed concurrently by using dual Damascene process, thereby simplifying the processes.

According to the present invention, an extension portion of the capacitor dielectric layer is interposed between the brim or top edge of the upper metal plate and the upper interconnect layer. The height of the extension portion can be adjusted higher than the thickness of the capacitor dielectric layer, thereby improving the leakage current characteristics.

Further, during formation of the via hole for exposing the lower interconnect layer, the capacitor dielectric layer interposed between the upper metal plate and the lower metal plate, is prevented from contacting the photoresist layer. Therefore, the capacitor dielectric layer is prevented from being contaminated by the organic components in the photoresist. Further, during the process of removing a native oxide layer on the exposed lower interconnect layer before forming the via plug, since the capacitor dielectric layer is not exposed, etch damage due to the removing process of the native oxide layer can be avoided.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A logic device comprising:
a semiconductor substrate;
a lower interconnect layer located over the semiconductor substrate;
an upper interconnect layer located over the lower interconnect layer;
a plurality of U-shaped lower metal plates interposed between the lower interconnect layer and the upper interconnect layer, and spaced from each other being in contact with the lower interconnect layer;
capacitor dielectric layers covering the inner surface of the respective lower metal plates and having extension portions interposed between a brim of the lower metal plates and the upper interconnect layer;
upper metal plates covering the inner surface of the respective capacitor dielectric layers, wherein each of the upper metal plates is in contact with the upper interconnect layer and is confined by the capacitor dielectric layer;
a second lower interconnect layer located at the same level as the first lower interconnect layer;
a second upper interconnect layer located at the same level as the first upper interconnect layer;
a via plug for electrically connecting the second lower interconnect layer and the second upper interconnect layer;
an interlayer insulating layer, surrounding the via plug, interposed between the second upper interconnect layer and the second lower interconnect layer; and
a via diffusion barrier layer interposed between the interlayer insulating layer and the via plug, and interposed between the second lower interconnect layer and the via plug, wherein the via diffusion barrier layer is formed of a different material than the upper metal plate layer.

2. The logic device according to claim 1, wherein the interlayer insulating layer extends to cover the outer side walls of the lower metal plates and the outer side walls of the extension portions of the capacitor dielectric layers.

3. The logic device according to claim 2, wherein the capacitor dielectric layers extend to be interposed between the interlayer insulating layer and the first upper interconnect layer, and are interposed between the interlayer insulating layer and the second upper interconnect layer.

4. The logic device according to claim 2, wherein the extension portions of the capacitor dielectric layers are 200 Å to 1000 Å in height.

5. The logic device according to claim 2, wherein the upper metal plate is at least one layer selected from the group including Ti, TiN, Ta, TaN, Ru, and WN layers.

6. The logic device according to claim 5, wherein the capacitor dielectric layer is at least one layer selected from the group including $Ta_2O_5$, $Al_2O_3$, $HfO_2$, $ZrO_2$, $La_2O_3$, $TiO_2$, ST and BST layers.

7. The logic device according to claim 6, wherein the via diffusion barrier layer is at least one layer selected from the group including Ti, TiN, Ta, TaN, Ru, and WN layers.

* * * * *